United States Patent [19]
Shepard

[11] Patent Number: 5,227,333
[45] Date of Patent: Jul. 13, 1993

[54] LOCAL INTERCONNECTION HAVING A GERMANIUM LAYER

[75] Inventor: Joseph F. Shepard, Hopewell Junction, N.Y.

[73] Assignee: International Business Machines Corporation, Armonk, N.Y.

[21] Appl. No.: 842,669

[22] Filed: Feb. 27, 1992

[51] Int. Cl.[5] ............... H01L 21/20; H01L 21/44
[52] U.S. Cl. ................... 437/189; 437/177; 437/192; 257/382; 257/384; 148/DIG. 58
[58] Field of Search ............ 437/177, 189, 191, 192, 437/193; 257/377, 382, 383, 384, 385

[56] References Cited

U.S. PATENT DOCUMENTS

| | | | |
|---|---|---|---|
| 4,188,710 | 2/1980 | Davey et al. | 29/580 |
| 4,593,307 | 6/1986 | Rupprecht et al. | 357/67 |
| 4,998,151 | 3/1991 | Korman et al. | 257/382 |
| 5,124,280 | 6/1992 | Wei et al. | 437/193 |
| 5,156,994 | 10/1992 | Moslehi | 437/89 |
| 5,173,450 | 12/1992 | Wei | 437/200 |

FOREIGN PATENT DOCUMENTS 1-41170  8/1989  Japan .

OTHER PUBLICATIONS

H. Hayashida, et al "Manufacturable Local Interconnect Technology full Compatible w/Ti Salicide Process" IEEE VMIC Proceedings, Jun. 11, 1991, pp. 332-334.

V. V. Lee, et al, "A Selective CVD Tungsten Local Interconnect Technology" IEDM 1988 pp. 450-453.

T. Tang, et al, "VLSI Local Interconnect Using Titanium Nitride" IEDM-1985 pp. 590-594.

O. Thomas, et al "Some Titanium Germanium and Silicon Compounds: Reaction and Properties" J. Mater. Res., v. 5, No. 7, Jul., 1990, pp. 1453-1462..

G. S. Oehrlein et al., "Selective Dry Etching of Germanium w/Respect to Silicon and Vice Versa" Abstract 145, ECS Meeting, Montreal, 1990. pp. 212-213.

G. S. Oehrlein, et al "Selective Dry Etching of Silicon With Respect to Germanium" Appl. Phys. Lett., vol. 56, No. 15-19, Apr., 1990, pp. 1436-1437.

R. M. Finne, et al "A Water-Amine-Complexing Agent System for Etching Silicon" J. ECS, 1967, pp. 965-970.

Primary Examiner—Olik Chaudhuri
Assistant Examiner—Ken Horton
Attorney, Agent, or Firm—Harold Huberfeld

[57] ABSTRACT

A process for making local interconnection of devices on a semiconductor substrate is disclosed. Contact openings are defined to a plurality of devices on the substrate. A blanket layer of germanium is deposited over the substrate, followed by deposition of a blanket layer of electrically conducting material on top of the germanium layer. The conducting layer is etched first stopping at the germanium layer. Subsequently the germanium layer is etched by a different process, selective to the conductive layer and the device contact. The conducting layer is preferably one of the following materials: polysilicon, silicide, a composite of polysilicon with metal or silicide films.

12 Claims, 3 Drawing Sheets

LOCAL INTERCONNECTION HAVING A GERMANIUM LAYER

FIELD OF INVENTION

The present invention relates generally to semiconductor manufacturing, and more particularly to the forming of electrical connections between devices on a semiconductor substrate.

BACKGROUND OF THE INVENTION

The effort to design and build chips containing a large number of circuits has resulted in miniaturization of the devices both horizontally and vertically. This miniaturization or shrinking has imposed new requirements on processes and materials used in contacts and interconnections. For example, in field effect transistor (FET) devices, the gate lengths and the depth of source and drain diffusion regions are continually being scaled down in order to achieve faster device speed and build more devices on unit area of the silicon chip. Already, the gate lengths are in the sub-micron range and the diffusion regions are in the 0.1 micron range. Hence, it has become important that the process and material used to make the contact and interconnect to the diffusion region must not react therewith and cause no degradation of the diffusion region characteristics. To achieve wiring of many possible circuits, a preferred approach has been to use a wiring level specifically to connect devices close to each other. Such closely located devices are connected together by short conductive straps, and appropriately this wiring is called local interconnection. It is important that the local interconnection contacting the device opening makes good electrical contact to the device and at the same time is reliable. Similar to FETs, dimensions in bipolar devices have also been miniaturized. The vertical dimension of the base width is less than 1000 A while the contact opening is in the sub micron range. In the case of advanced bipolar devices, direct contact to device regions are avoided by use of polysilicon layers on emitter and extrinsic base contacts. This reduces the concern of reactivity. However, low electrical contact resistance is still required between the polysilicon and the local interconnection material.

Yet another requirement for high density circuits is the capability of using a "partially covered" contact design, wherein an interconnection strap covers the contact opening only partially. The achievement of good electrical contact becomes more challenging when partially covered contacts are allowed, because of the decrease in intersecting area between the contact and the strap. A typical "partially covered" contact design is illustrated in FIG. 1. Referring to FIG. 1, the contact opening 10 is larger than the width of the interconnection strap 20. The strap 20 can intersect 10 in ways other than shown, but in all cases, the area of the contact opening will not be fully covered by the strap 20. The benefit of using a partially covered contact is the ability to use the smallest allowed features for lines and spaces, thereby realizing the wiring of a larger number of devices by permitting high density wiring.

Usually, the local interconnection is made over a non-planar surface, which means significant overetching of the interconnect material will be required to clear unwanted material from everywhere except under the resist mask. Of important concern, is the thickness variation of the film resulting from the device topography, which can result in incompletely etched residues. The residues can cause electrical shorts between adjacent contacts or interconnects and result in yield losses.

The key requirements for the local interconnect process and material can be summarized as follows: ability to use partially covered contact design, ability to overetch, good electrical contact to silicon and no reaction with the device contact region.

The present art of local interconnection attempts to achieve the above objectives, but is usually deficient in meeting some of the goals. This will be shown with the discussion of the following prior art. FIG. 2 shows a cross section of an FET device and a resulting interconnect structure disclosed by Hayashida et al. (IEEE VMIC Conference Proceedings, June, 1991, p. 332). The Hayashida et al. article discloses a silicon substrate 25 including an FET device, with a source 55 and drain 56 regions (N+), and a gate structure 45 formed by known processes not discussed here. After the contact apertures 46, 46' are opened, corresponding to the source and drain regions, a thin silicon oxide 50, also referred to as a "barrier oxide", is grown over the exposed silicon surfaces at the contact openings. FIG. 2 further shows the FET device with recessed oxide device isolation 35. A polysilicon interconnect film is blanket deposited and etched to make wiring 30 by use of a resist pattern (not shown) and by use of the barrier oxide layer 50 underneath as an etch stop. Subsequently the barrier oxide is removed from the contact region except under the polysilicon by a different etching process, leaving the oxide 50' underneath a polysilicon strap 30 and the contact opening surface 46 as shown. The silicon oxide layer 50, electrically insulates the polysilicon strap 30 from the contact. The polysilicon only partially covers the contact opening area to the source or drain. At this point, Hayashida et al., deposits a layer of blanket Titanium 40 over all surfaces. By suitable heating, the Titanium film reacts with the silicon over the contact surface and with the polysilicon top surface and sidewalls to form Titanium silicide. Unreacted titanium is later removed from the device surface. However, there is no silicide formation with the sidewall of the barrier oxide 50'. The Titanium silicide link over the side wall of oxide 50' primarily occurs from the overgrowth of the silicide from the polysilicon 30 sidewall and that from silicon contact surface 46 adjacent to the oxide film 50'. This Titanium silicide link going over the sidewall of the silicon oxide 50', is a vulnerable part of the bridging between the polysilicon strap and the silicon contact. In addition the requirement of the strap material not reacting with the doped silicon at the contact is not achieved. Lee et al. (IEDM, 1988 proceedings pp. 450-453) uses a slightly different process than that of Hayashida. The process steps are identical until the polysilicon is etched over the contact using the field oxide as the etch stop. At this point, in the Lee et al. process, the field oxide is etched away, and tungsten is deposited selectively over the silicon in the contact and the polysilicon strap, the selective W layer forming the electrical bridge over the field oxide step. Since W does not nucleate on the sidewall of the thin oxide, the film bridging comes from the overgrowth of the grains nucleating on the polysilicon sidewall and the contact silicon surface. The integrity of the W film to provide a reliable bridge is a main concern with this approach. In both these processes, a main draw back is that the area of the device contact under the polysilicon is unused, thereby potentially causing high contact resistance. Further, this area reduction is likely to vary depending on lithography and process tolerances. In a worst case, the area reduction penalty can become unacceptable for small contacts. In a third method (Tang et al, IEDM p. 590, 1985), the contact regions are silicided and a titanium nitride film is etched to form the local interconnect, by use of titanium silicide as an etch stop layer. The main drawback of this approach is the need to silicide the contact, which is not desirable for shallow diffusions. It is clear that all these methods have significant drawbacks and do not meet the objectives described earlier. It would be particularly valuable in the art, especially as it relates to local interconnection on a semiconductor substrate, to provide a method that allows partially overlapping contact, allows overetching for yield on devices with topography, makes a good electrical contact (low resistance) to silicon and does not degrade the device contact by reacting with the silicon at the contact. The concern with device degradation is serious when the diffusion depths are shallow (about 0.1 micron), as the case with many future devices.

OBJECTS OF THE INVENTION

An object of the present invention is the provision of a high yielding manufacturing process for local interconnect on a device with non-planar surfaces.

Another object of the invention is the provision of a process that will allow the use of borderless contacts for improved wirability.

Yet another object of the invention is the provision of such a process while allowing overetching of the local interconnect material without any damage to the underlying silicon.

A further object of the invention is the provision of an interconnect process that causes minimal degradation of the device being contacted.

Still another object of the invention is the provision that such a process is compatible with bipolar and FET manufacturing.

SUMMARY OF THE INVENTION

A process for making local interconnection of devices on a semiconductor substrate is disclosed. Contact openings are defined to a plurality of devices on the substrate. A blanket layer of germanium is deposited over the substrate, followed by deposition of a blanket layer of electrically conducting material on top of the germanium layer. The conducting layer is etched first stopping at the germanium layer. Subsequently the germanium layer is etched by a different process, selective to the conductive layer and the device contact. The conducting layer is preferably one of the following materials: polysilicon, silicide, a composite of polysilicon with metal or silicide films.

BRIEF DESCRIPTION OF THE DRAWINGS

The objects, features and advantages of the invention will be apparent from the following more particular description of the invention as illustrated in the accompanying drawings, in which.

DETAILED DESCRIPTION OF THE INVENTION

Figure 1:
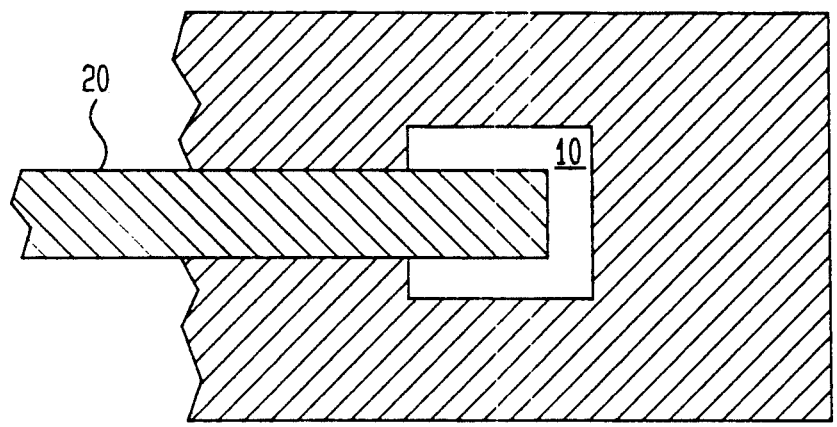
FIG. 1 illustrates a partially overlapped prior contact design.
Figure 2:
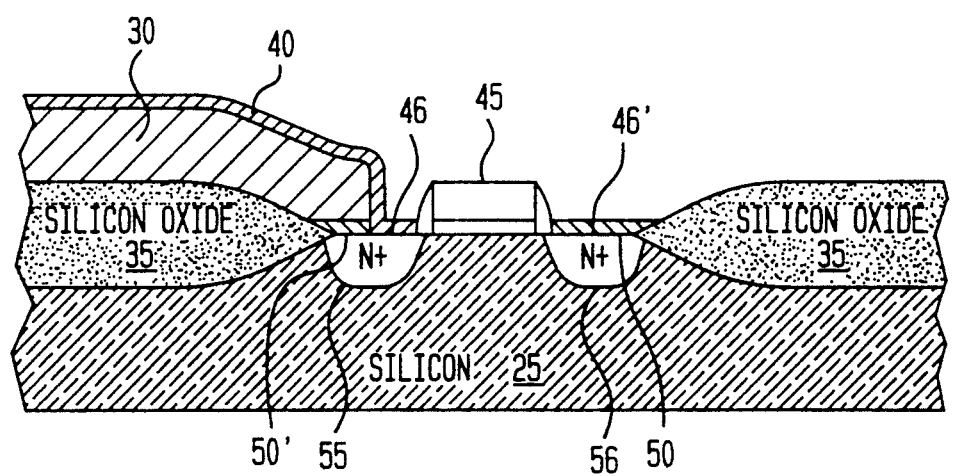
FIG. 2 is a cross sectional view of a prior FET device with a local interconnect.
Figure 3:
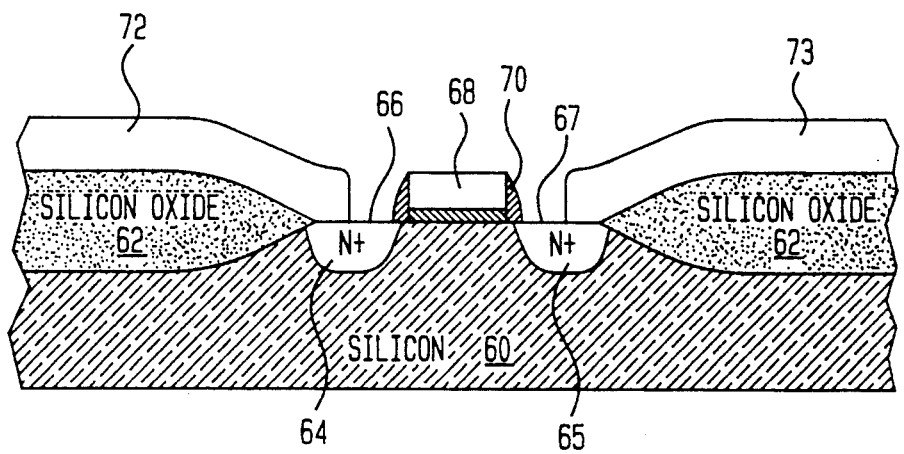
FIG. 3 shows an idealized FET device with a local interconnect strap making a partially covered contact to the diffusion regions (source and drain) to illustrate the problems solved by the present invention.

Referring now to the drawings, FIG. 3 illustrates an FET device on a silicon substrate 60, with diffused source 64 and drain 65 regions. FIG. 3 further shows contact openings 66, 67 to these regions. The FET device has a recessed oxide isolation region 62 and a gate structure 68. A conducting polysilicon strap 72 is shown making contact to source region opening 66. The contact illustrated in FIG. 3 is referred to as a "buried contact", wherein the polysilicon strap used for local interconnection makes direct contact to the doped source/drain regions of the FET device. These contacts without an intermediate contact layer such as silicide or metal over the doped regions, are desirable for forming high density FET circuits using shallow diffusion regions. In the case of bipolar devices, the contacts could be an emitter, base, collector, a Schottky diode or a resistor contact. The oxide isolation 62, though shown here to be a recessed oxide isolation (ROI), can also be a shallow trench isolation. The local interconnect strap 72, described earlier as polysilicon can also be a composite film, wherein a metal or a silicide film is deposited over the polysilicon film to form a composite structure.

The invention as shown can be applied to an FET device having a shallow trench isolation structure instead of recessed oxide isolation. Referring further to FIG. 3, the FET device, having a source, drain and the gate is fabricated by known processes not described in here. The openings 66, 67 to source and drain regions are made by etching apertures in the oxide layer over the diffusion regions, thereby exposing the silicon surface.

Figure 4:
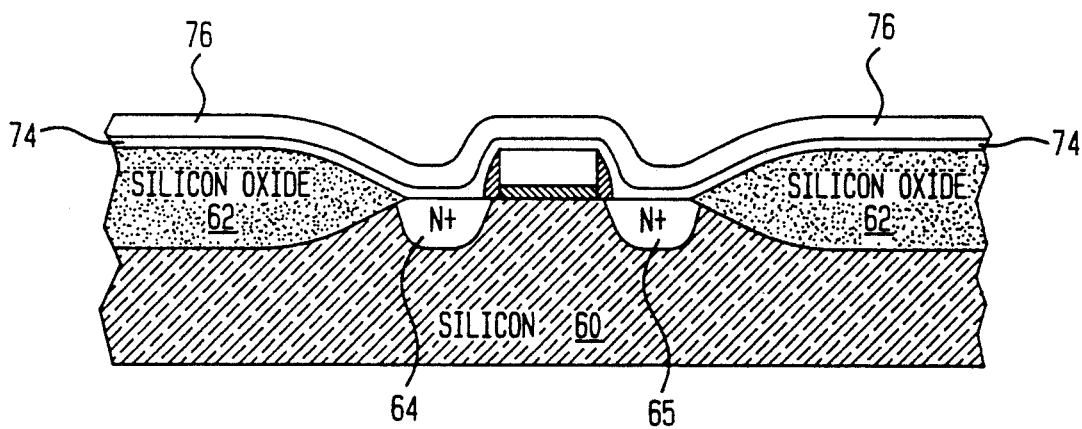
FIGS. 4 to 6 are cross sectional views of an FET device illustrating consecutive process steps in the formation of the local interconnect in accordance with the present invention.

Now referring to FIG. 4, a blanket layer of germanium 74 is deposited over the entire surface of the substrate 60, contiguous and in contact with the various surfaces present as shown. The germanium is deposited preferably by chemical vapor deposition (CVD) or sputtering; however, it can also be deposited by any of the following techniques: evaporation, ion beam deposition including, molecular beam epitaxy (MBE) and plasma assisted CVD. The layer 74, can be germanium or a germanium-silicon alloy containing up to 30 percent of silicon by volume. The addition of silicon to germanium serves to improve the interface between the deposited layer and the contact silicon surface by reducing lattice mismatch between germanium and silicon. In the case of bipolar devices, such contacts can be made to one or more of the following: the base, collector and emitter contacts of the transistors, resistors or Schottky diodes. The process steps of the present invention as described for the FET case above apply similarly to bipolar devices. In addition, the use of a germanium layer underneath the polysilicon, can be used also to make local interconnect with contacts other than silicon, such as silicide and metal contacts for both FET and bipolar devices. The thickness of layer 74 is preferably in the range of 250 A to 2000 A, the preferred thickness being about 500 A. Another blanket layer 76 is deposited over the germanium layer 74, layer 76 being the primary local interconnect layer. This layer can be a doped polysilicon film, or a composite of a combination of polysilicon and a plurality of conducting films covering the polysilicon. In either case, the bottom layer in contact with layer 74 is preferably polysilicon, and the layers above can be metallic or metal silicide films to improve the conductivity of the interconnect strap. The thickness of the interconnect layer can vary up to 1 micron, the preferred thickness however is preferably in the range of 3 to 5 KA. The films making up layer 76 can be deposited by any of the following known techniques: CVD, sputtering, evaporation and ion beam deposition. When layer 76 is a composite layer, one of the required attributes of the cladding layer is that it be etchable with some selectivity to the polysilicon layer, so that overetching can be performed. The minimum selectivity desired for the process of the present invention is that the top layer etch a minimum of three times faster than the underlying layer. For example, W can be etched selectively over silicon by using plasmas containing fluoro-carbon gases.

Figure 5:
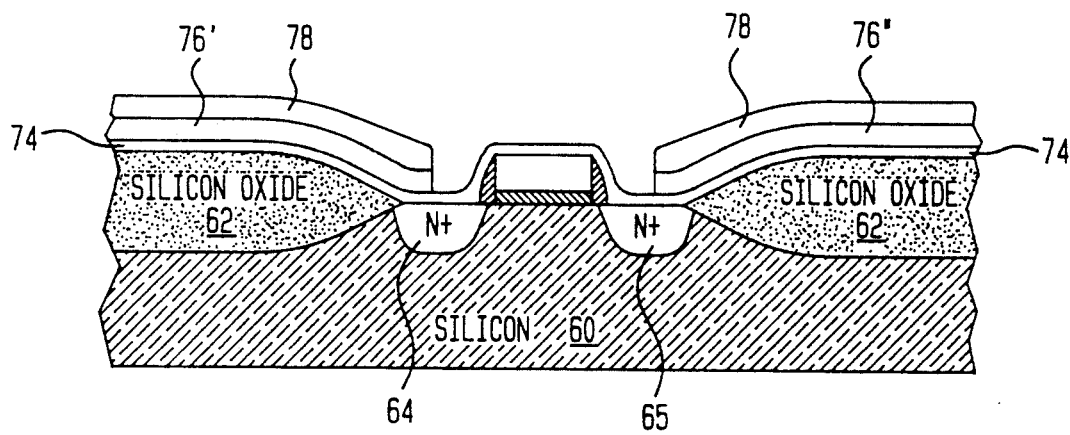

Referring to FIG. 5, a photoresist pattern layer 78 is formed by known processes, such as forming a resist coating, exposing the resist to UV radiation using a glass mask, developing the resist and baking or hardening as required. Using the resist mask, the local interconnect is etched, first by etching the layer 76 of FIG. 4 in a plasma containing SF6/H2/CF4 which has a very low etch rate of Ge (Oehrlein G. S., et al. ECS meeting Abstracts, p. 212, Montreal 1990). Alternatively, the silicon can be wet etched using a solution, that etches silicon selectively and stops on layers of germanium or germanium containing up to 30 percent of silicon. A ternary mixture of water, ethylenediamine and pyrocatechol (R. M. Finne and D. L. Klein, J. Electrochemical Soc., 1967, pp. 965-970;) is a suitable solution. As a result of this etch process local straps 76' and 76" of patterned polysilicon are formed on the device.

Figure 6:
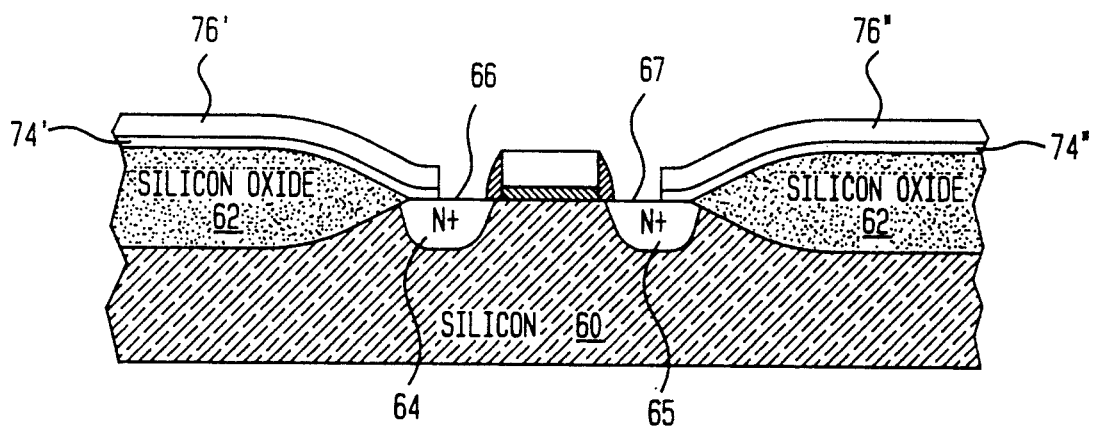

Now referring to FIG. 6, after sufficient overetch of the layer 76, the etch gases are changed to chlorine containing fluorocarbons such as CF2Cl2 to etch the bottom germanium layer 74 under conditions of low etch rate for silicon. Alternatively, wet etching of germanium or germanium rich layer can be done with a solution selective to silicon. An example of such a solution is a mixture of hydrogen peroxide and hydrochloric acid. Thus the local interconnect layer connecting adjacent devices, consisting of a patterned polysilicon layer 76' and 76" and a germanium layer 74' and 74" contacting the opening surface 66 and 67 respectively is achieved. The remaining resist layer 78 is removed by oxygen plasma, wet solvent strip or by combination of both. Even though the specific etch processes described here address the use of polysilicon and germanium bilayers, different etch processes can be used if a multilayer structure is used consisting of polysilicon with a metal or silicide layer as described in the specification earlier.

There is thus provided a method for forming a local interconnection with the desirable attributes of good electrical contact to shallow silicon devices, partial overlapping of interconnect to contact openings and allows overetching to achieve good electrical yield on devices with topography. The process steps are easily integrated with conventional semiconductor manufacturing equipment and techniques. The present invention has utility especially in the area of local interconnection for achieving high circuit connections in manufacturing.

While the invention has been described in terms of a single preferred embodiment, various alternatives and modifications can be deviced by those skilled in the art without departing from the invention. Accordingly, the present invention embraces all such alternatives and modifications which fall within the scope of the appended claims.

What is claimed is:

1. A method of fabricating a local interconnection of devices on a semiconductor substrate, comprising the steps:
   providing a semiconductor substrate containing a plurality of devices, covered by a passivating film;
   forming openings in said passivating film to provide for electrical contacts to said devices;
   depositing an electrically conducting layer of substantially germanium over all exposed surfaces of the resulting structure;
   subsequently depositing a second electrically conducting layer over said germanium layer;
   etching a pattern in said second layer including over said contact surfaces by a first etch process, stopping on said germanium; and,
   etching said germanium layer by a second etch process selective to said second layer and to said contact surfaces of said devices, thereby connecting said device openings to form a electrical connection.

2. The method of claim 1, wherein said deposited second layer includes polysilicon.

3. The method of claim 2, wherein said deposited second layer is a composite film formed by sequentially depositing a layer of polysilicon, followed by a layer selected from the group comprising a silicide and a metal layer over said layer of polysilicon.

4. The method of claim 3, wherein said metal layer is selected from a group consisting of W, Mo, Ti.

5. The method of claim 1, wherein said first etch process is performed by reactive ion etching.

6. The method of claim 4, wherein said etch process uses a gas mixture containing SF6, H2 and CF4.

7. The method of claim 4 wherein said first etch process is performed by wet etching using pyrocatechol-ethylene diamine.

8. The method of claim 1, wherein said second etch process is performed by wet etching, for selectively removing germanium in a liquid mixture of hydrogen peroxide and hydrochloric acid.

9. The method of claim 7, wherein said second etch process is performed by reactive ion etching under conditions of high selectivity between said second layer and said first layer.

10. The method of claim 9, wherein said reactive ion etching is performed using a gas mixture containing CF2Cl2.

11. The method of claim 1, wherein said germanium layer is deposited by a process selected from a group consisting of chemical vapor deposition, physical sputtering, evaporation, ion beam deposition and plasma assisted deposition.

12. The method of claim 1, wherein said second layer is deposited by a process selected from a group consisting of chemical vapor deposition, physical sputtering, evaporation, ion beam deposition and plasma assisted deposition.

* * * * *